350-96.1

XR 3,939,052

United States

Riley

[11] 3,939,052

[45] Feb. 17, 1976

[54] DEPOSITING OPTICAL FIBERS

[76] Inventor: Leon H. Riley, 7707 Logan Drive SW., Huntsville, Ala. 35802

[22] Filed: Jan. 15, 1975

[21] Appl. No.: 541,363

[52] U.S. Cl................ 204/192; 204/298; 350/96 R
[51] Int. Cl.² .................... C23C 15/00; G02B 5/16
[58] Field of Search ......... 204/192, 298; 427/38, 39

[56] References Cited
UNITED STATES PATENTS

| | | | |
|---|---|---|---|
| 3,494,853 | 2/1970 | Anderson et al. ................... | 204/298 |
| 3,676,320 | 7/1972 | Christensen ......................... | 204/192 |
| 3,884,787 | 5/1975 | Kuehnle .............................. | 204/192 |
| B236,609 | 1/1975 | Bernard .............................. | 204/298 |

*Primary Examiner*—T. Tung
*Assistant Examiner*—Aaron Weisstuch
*Attorney, Agent, or Firm*—Nathan Edelberg; Robert P. Gibson; Charles R. Carter

[57] ABSTRACT

A system for depositing and definitely positioning optical fibers on a base material. The process includes depositing a cladding base on a plastic tape by radio frequency triode sputtering. A slitted mask is placed over the cladded tape and fiber core material is sputtered onto the cladded surface in a controlled manner to form strips of fiber cores on the cladded base.

3 Claims, 5 Drawing Figures

DEPOSITING OPTICAL FIBERS

BACKGROUND OF THE INVENTION

This invention relates to the field of fiber optics. Present fiber optics are made by drawing glass or plastic filaments from a larger stock. This drawing process produces individual fibers that are tedious and expensive to handle since the fibers must be handled individually for positioning in applications such as image reproduction. Further problems are encountered in that the drawing of conventional fiber optics imparts physical stresses into the fibers that effect optical performance.

SUMMARY OF THE INVENTION

The present invention has overcome these problems by depositing optical fibers on a base material that provides for precision placement of the fibers. Thus a group of fibers can be prepared for splicing and spliced simultaneously due to their precise positioning. Physical stresses are not imparted in deposited fibers.

This invention may be better understood from the following detailed description taken in conjunction with the accompanying drawing.

DESCRIPTION OF THE PREFERRED EMBODIMENT

Figure 1:
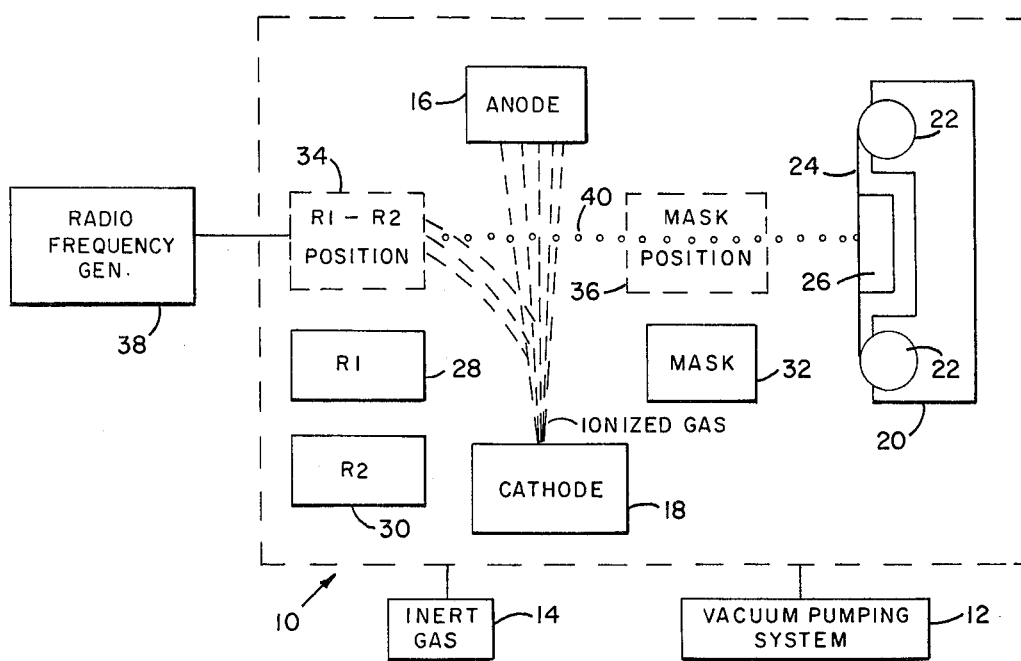
FIG. 1 is a diagrammatic block diagram of the fiber optic depositing system.

Referring now to the drawing reference numeral 10 generally represents a vacuum enclosure incorporating a low pressure gas sputtering atmosphere. A vacuum pump 12 is used for evacuating the enclosure while an inert gas source 14 is connected to the enclosure for supplying inert gas. Within the enclosure is a triode sputtering device shown with an anode 16 and a cathode 18 to create an ionized gas atmosphere. As shown in the drawing a plastic base tape feeding device 20 includes two reels 22 for feeding the tape 24 over a deposition position 26 to expose the tape as it moves past this position. Disposed to one side of the anode-cathode path is a supply 28 of cladding material having a refractive index R1 and a supply 30 of fiber core having a refractive index R2. On the opposite side of the anode-cathode path is an interruption mask 32 that has slit openings therein. Reference numeral 34 indicates a target location wherein R1 or R2 are positioned and numeral 36 indicates a location wherein the mask is positioned during the fiber core depositing operation. A radio frequency generator 38 is used to control movement of the ionized gas molecules (ions) during depositing operations.

Figure 2:
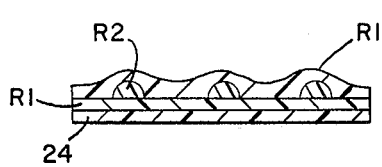
FIG. 2 is a side view of a single layer deposited fiber optic.

In operation, the vacuum enclosure is evacuated and back filled to the proper pressure with the inert gas 14. An ionized plasma is formed between the anode and cathode and the cladding material R1 is moved to target location 34. The radio frequency generator is turned on and the cladding material is sputtered onto the plastic tape. The sputtering is caused by the generator attracting ionized molecules (ions) from the ionized gas and these molecules impinge onto R1 cladding material. This impingement causes release of the cladding material in a sputtering effect as shown by 40. The tape feed is energized to pass the tape over the deposition position 26 and the cladded material is coated onto the tape. This coating of the tape continues until a desired length of tape is coated. The generator 38 is turned off and R1 is replaced by fiber core R2. Mask 32 is moved to the mask position 36. The generator is then energized and the cladded tape is now passed over the position 26. Fiber core material R2 is sputtered through the slits in the mask to form strips of fiber core on the cladded tape, as shown in FIG. 2, as the tape is driven past the deposition position. When core application is completed on the desired tape length the generator 38 is cut off. The sputtering and tape movement operation is repeated, coating the core material with a layer of cladding material.

Figure 3:
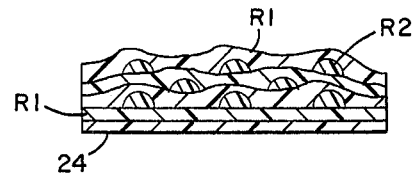
FIG. 3 is a side view of a deposited stack of fiber optics.

The deposition of additional cores and cladding material may be repeated to give a stack of fibers as shown in FIG. 3.

Figure 4:
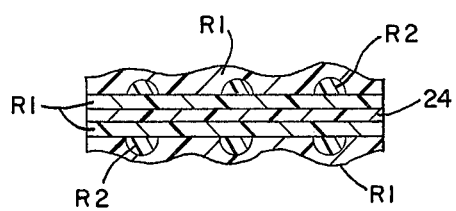
FIG. 4 is a side view showing fiber optics deposited on both sides of the base tape.

FIG. 4 shows the depositing of cores on both sides of a tape for use as a fiber optic lens.

Figure 5:
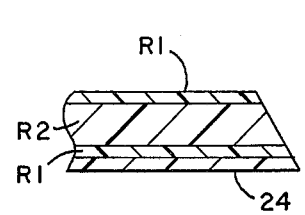
FIG. 5 is a side view showing how the individual fibers are spliced together.

FIG. 5 shows splicing of different sections of fiber optics.

I claim:

1. A process for depositing and positioning optical fiber cores onto a base tape in a predetermined manner, comprising:
    evacuating a vacuum enclosure;
    filling said enclosure with an inert gas;
    forming an ionized plasma within said enclosure;
    positioning a supply of cladding material in a target position;
    energizing a tape feed to pass plastic tape over a deposition position;
    actuating a control means to cause sputtering of said cladding material onto said plastic tape;
    removing said cladding material supply from said target position;
    positioning a supply of fiber core material in said target position;
    placing an interruption mask over said deposition position, and
    re-energizing said tape feed and said control means to cause sputtering of said fiber core material through said interruption mask onto a cladded plastic tape.

2. A process as defined in claim 1 wherein said control means includes a radio frequency generator.

3. A process as defined in claim 1 wherein said interruption mask is provided with a plurality of slits to definitely position fiber cores on said cladded tape.

* * * * *